(12) United States Patent
Session

(10) Patent No.: US 8,044,461 B2
(45) Date of Patent: Oct. 25, 2011

(54) PLANAR TMBS RECTIFIER

(75) Inventor: Fred Session, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/795,368

(22) Filed: Jun. 7, 2010

(65) Prior Publication Data

US 2011/0079845 A1    Apr. 7, 2011

Related U.S. Application Data

(63) Continuation of application No. 11/747,847, filed on May 11, 2007, now Pat. No. 7,732,842.

(60) Provisional application No. 60/868,884, filed on Dec. 6, 2006.

(51) Int. Cl.
*H01L 27/095* (2006.01)

(52) U.S. Cl. ............... 257/334; 257/267; 257/E33.051

(58) Field of Classification Search ............... 257/334, 257/E27.068, 267, 280, 284, 471, E33.051; 438/167, 57

See application file for complete search history.

(56) References Cited

U.S. PATENT DOCUMENTS

| | | | |
|---|---|---|---|
| 6,479,394 | B1 | 11/2002 | Choutov et al. |
| 6,498,108 | B2 | 12/2002 | Cao et al. |
| 7,041,600 | B2 | 5/2006 | Dokumaci et al. |
| 7,345,342 | B2 | 3/2008 | Challa et al. |
| 7,732,842 | B2 | 6/2010 | Session |
| 2006/0267090 | A1 | 11/2006 | Sapp et al. |

FOREIGN PATENT DOCUMENTS

| | | |
|---|---|---|
| CN | 1790745 A | 6/2006 |
| TW | 200834922 A | 8/2008 |
| WO | WO 2008/070491 A3 | 6/2008 |

OTHER PUBLICATIONS

Chinese Office Action for Application No. 200780045391.7, mailed on Oct. 13, 2010, 17 pages.
Huang et al., "Characterization of SOG (spin on glass) fully etch back process for multilevel interconnection technology," SPIE, 1995, pp. 289-298, vol. 2636.
Lazzi, et al., Semi-integrated SOG/TEOS etchback process for multimetal submicron devices,: SPIE, 1992, pp. 77-88, vol. 1803.
Notice of Allowance for U.S. Appl. No. 11/747,847, mailed on Jan. 25, 2010, 12 pages.
International Search Report of the International Searching Authority for Application No. PCT/US2007/085722, mailed on Jun. 18, 2008, 2 pages.
Written Opinion for Application No. PCT/US2007/085722, mailed on Jun. 18, 2008, 6 pages.
International Preliminary Report on Patentability for Application No. PCT/US2007/085722, mailed on Jun. 18, 2009, 8 pages.

*Primary Examiner* — Roy K Potter
(74) *Attorney, Agent, or Firm* — Kilpatrick Townsend & Stockton LLP

(57) ABSTRACT

A monolithically integrated trench FET and Schottky diode includes a plurality of trenches extending into a FET region and a Schottky region of a semiconductor layer. A trench in the Schottky region includes a dielectric layer lining the trench sidewalls, and a conductive electrode having a top surface that is substantially coplanar with a top surface of the semiconductor layer adjacent the trench. An interconnect layer electrically contacts the semiconductor layer in the Schottky region so as to form a Schottky contact with the semiconductor layer.

7 Claims, 5 Drawing Sheets

PLANAR TMBS RECTIFIER

CROSS-REFERENCES TO RELATED APPLICATIONS

This application claims the benefit of U.S. Provisional Application No. 60/868,884, filed Dec. 6, 2006, which disclosure is incorporated herein by reference in its entirety for all purposes.

This application is related to the commonly assigned U.S. application Ser. No. 11/026,276, filed Dec. 29, 2004, which disclosure is incorporated herein by reference in its entirety for all purposes.

BACKGROUND OF THE INVENTION

The present invention relates to semiconductor power device technology and more particularly to monolithically integrated trench FET and Schottky diode devices as well as trench MOS barrier Schottky (TMBS) rectifiers, and methods of manufacturing the same.

In power device structures where Schottky diode is integrated with a trench gate structure (e.g., TMBS rectifiers or monolithically integrated trench gate FET and Schottky diode devices), known Schottky contact etch techniques produce topologies that lead to poor barrier metal step coverage and high leakage current. These techniques are based on standard contact etch processes where selectivity to the underlying material is desirable. One such technique is shown in FIGS. 1A-1B.

As depicted in FIGS. 1A and 1B, in the Schottky diode region of the device, a selective dielectric etch is carried out to form the Schottky contact opening as defined by remaining dielectric portions 116. Because the resulting topology in the Schottky region is not suitable for forming the barrier metal, a selective soft etch of the silicon is carried out to improve the topology. However, the soft etch process: (1) adds another process step, (2) leads to the undercutting of source contact 132 thus bringing source metal closer to the channel region, and (3) adversely affects the metal fill characteristics of the source contact. Also, as can bee seen in FIG. 1B, while the topology is somewhat improved by the soft etch, the barrier metal 122 still has poor step coverage.

Thus, there is a need for a technique which significantly improves the topography in the Schottky contact area and minimizes the leakage current.

BRIEF SUMMARY OF THE INVENTION

In accordance with an embodiment of the invention, a monolithically integrated trench FET and Schottky diode includes a plurality of trenches extending into a FET region and a Schottky region of a semiconductor layer. A trench in the Schottky region includes a dielectric layer lining the trench sidewalls and a conductive electrode having a top surface that is substantially coplanar with a top surface of the semiconductor region adjacent the trench. An interconnect layer electrically contacts the semiconductor layer in the Schottky region so as to form a Schottky contact with the semiconductor layer.

In one embodiment, a trench in the FET region includes a shield dielectric layer lining lower sidewalls and bottom of the trench, a shield electrode disposed in a bottom portion of the trench, an inter-electrode dielectric layer over the shield electrode, and a gate dielectric layer lining upper trench sidewalls. The gate dielectric layer is thinner than the shield dielectric layer. The trench in the FET region further includes a gate electrode over the inter-electrode dielectric layer.

In another embodiment, a trench in the Schottky region includes only one conductive electrode.

In accordance with another embodiment of the invention, a method of forming a monolithically integrated trench FET and Schottky diode includes the following steps. A plurality of trenches is formed in a FET region and a Schottky region of a semiconductor layer. A recessed conductive electrode is formed in each trench. A contact opening is formed in the Schottky region by removing at least a portion of the semiconductor layer and a portion of a recessed conductive electrode in a trench so that a top surface of the recessed conductive electrode and a top surface of the semiconductor layer in the Schottky region are substantially coplanar.

In one embodiment, after forming the contact opening, an interconnect layer electrically contacting surfaces of the semiconductor layer is formed so as to form a Schottky contact with the semiconductor layer.

In another embodiment, prior to forming the contact opening, a dielectric layer is formed over the semiconductor layer, and the step of forming a contact opening further includes removing a portion of the dielectric material.

In yet another embodiment, the portion of the dielectric layer, the at least a portion of the semiconductor layer and the portion of a conductive electrode in a trench are all removed using an etch process that etches the dielectric layer and the semiconductor substrate at substantially the same rate.

In still another embodiment, the portion of the dielectric layer, the at least a portion of the semiconductor layer and the portion of a conductive electrode in a trench are all removed using an etch process that has low selectivity between the dielectric layer and the semiconductor layer.

In still another embodiment, prior to forming a contact opening, a protective layer is formed over the dielectric layer, followed by removing at least a portion of the protective layer to define the contact opening.

A further understanding of the nature and the advantages of the invention disclosed herein may be realized by reference to the remaining portions of the specification and the attached drawings.

DETAILED DESCRIPTION OF THE INVENTION

In accordance with an embodiment of the invention, a Schottky contact etch process with substantially reduced dielectric to silicon selectivity is disclosed which eliminates the need for intermediate steps (such as a soft etch). The reduced selectivity results in a more planarized (i.e., reduced topology) surface. This reduced topology in turn results in formation of a substantially planar barrier metal which provides a significant reduction (10 times in one embodiment) in drain-source leakage. Other features and advantages of the invention are disclosed below.

FIGS. 2A-2F are simplified cross section views at various stages of a process for forming a monolithically integrated shielded-gate FET and Schottky diode, in accordance with one embodiment of the invention. In FIGS. 2A-2F, the Schottky diode region is shown on the right side of the figures and the FET region is shown on the left side. It is to be understood that only a small portion of the active region of the device is shown in FIGS. 2A-2F, and many ways of integrating the Schottky diode and the FET are possible. Many Schottky regions similar to that shown in FIGS. 2A-2F are typically dispersed throughout the active region of the device in a predetermined frequency which in part depends on the desired percentage of Schottky diode area. While three trenches are shown in a given Schottky region, more or fewer trenches may be formed in the Schottky region.

Figure 1A:
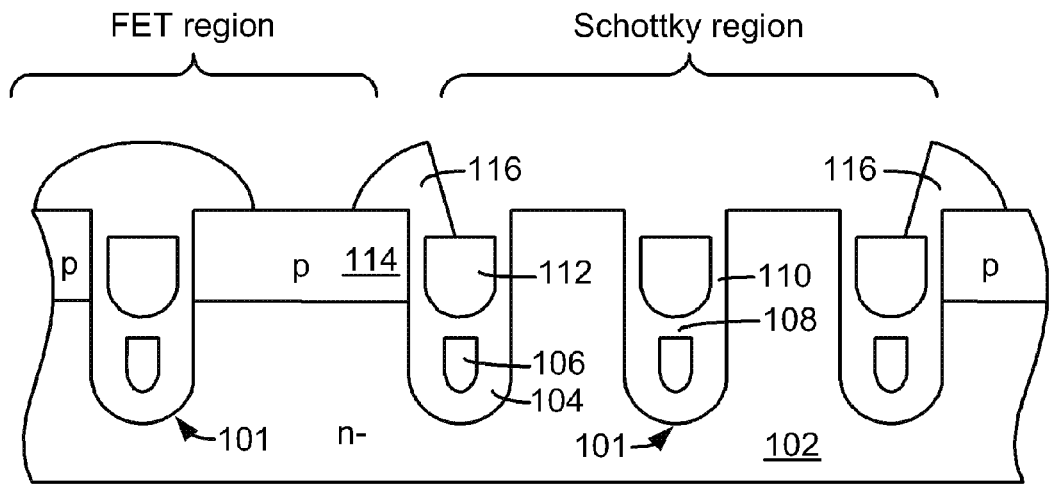
FIGS. 1A-1B are simplified cross section views depicting a known Schottky contact etch technique.
Figure 1B:
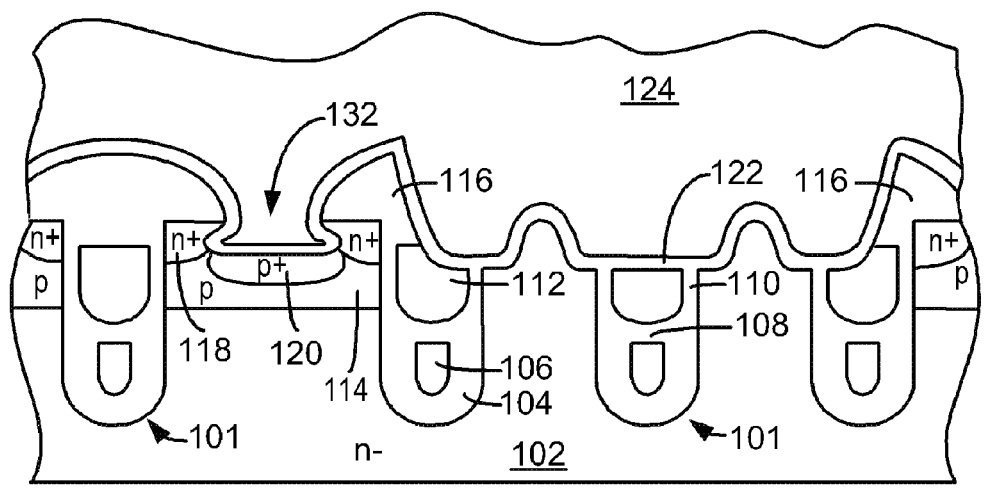
Figure 2A:
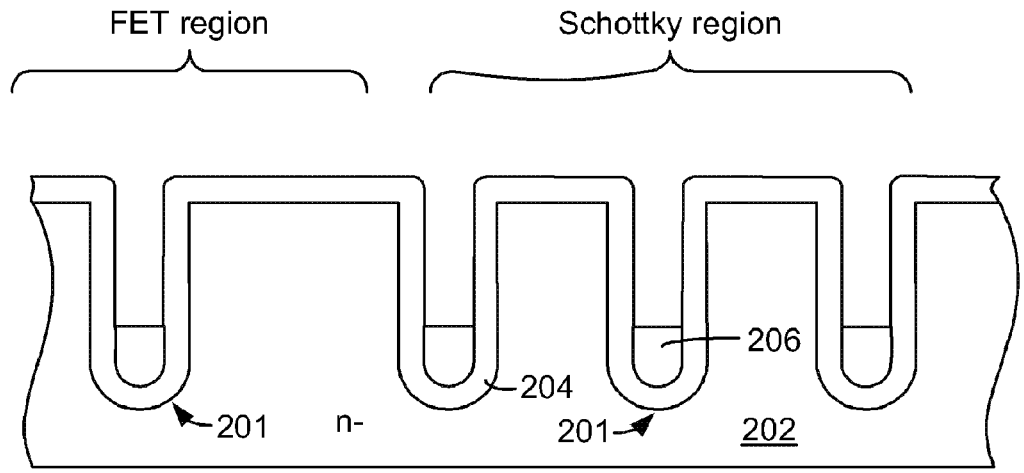
FIGS. 2A-2F are simplified cross section views at various stages of a process for forming a monolithically integrated shielded-gate FET and Schottky diode, according to one embodiment of the invention.

In FIG. 2A, trenches 201 extend into semiconductor region 202. In one embodiment, the semiconductor region is a lightly doped n-type epitaxial layer formed over a highly doped substrate (not shown), and trenches 201 terminate in the epitaxial layer. In another embodiment, trenches 201 extend into and terminate in the substrate. In FIG. 2A, a shield dielectric layer 204 (e.g., comprising oxide) lining the trench sidewalls and bottom is formed using known techniques. Shield electrode 206 (e.g., comprising doped or undoped polysilicon) is then formed in a bottom portion of each trench using conventional methods.

Figure 2B:
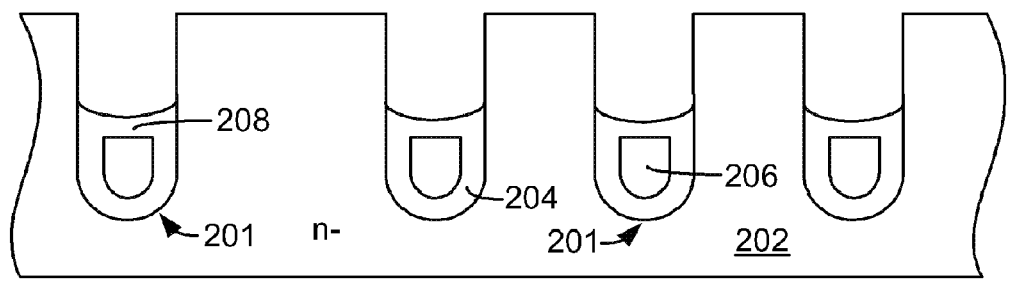
Figure 2C:
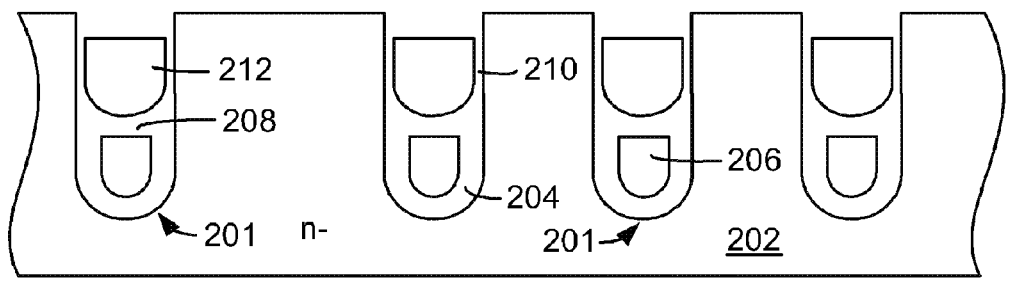
Figure 2D:
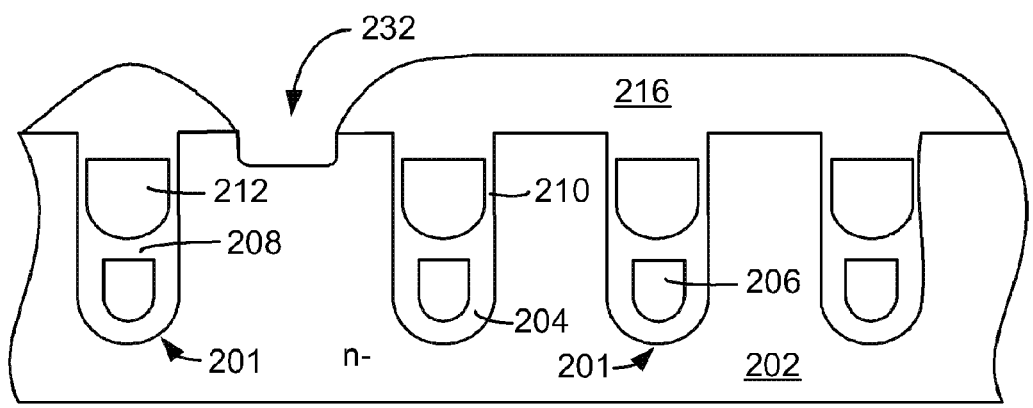

In FIG. 2B, inter-electrode dielectric 208 (e.g., comprising oxide) is formed over shield electrode 206 in each trench using known methods. In FIG. 2C, a recessed gate electrode 212 (e.g., comprising doped or undoped polysilicon) is formed over inter-electrode dielectric 208 in each trench using conventional techniques. In FIG. 2D, a dielectric layer 216 (e.g., comprising one or more of BPSG, undoped oxide, and PSG) is formed over the structure. In the FET region, source contact openings 232 are formed in dielectric layer 216 using known masking techniques. The silicon surfaces exposed through source contact openings are then recessed to form heavy body contact openings as shown.

Figure 2E:
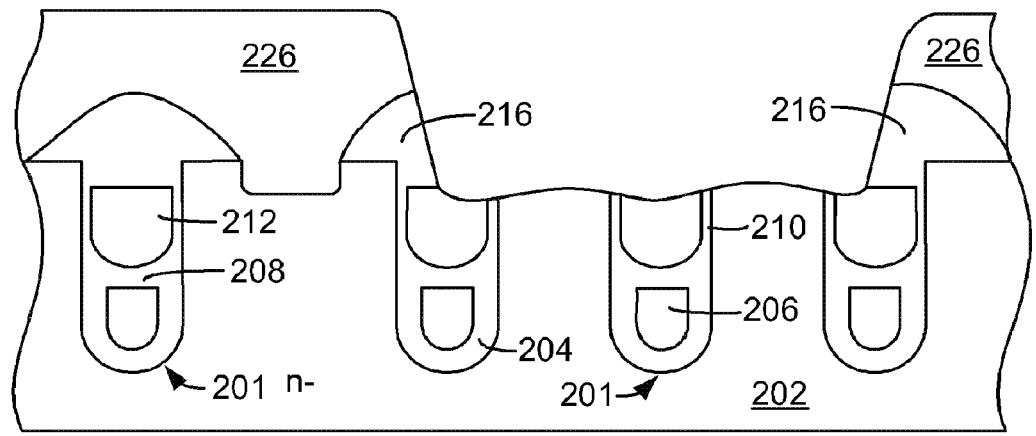

In FIG. 2E, a masking layer 226 (e.g., comprising photoresist) having openings only over Schottky regions is formed using conventional techniques. Masking layer 226 thus covers all FET regions. Using an etch process that etches dielectric layer 216 at substantially the same rate as it would etch the underlying silicon, the exposed portions of dielectric layer 216 and a portion of the underlying silicon are removed such that a planar surface is obtained in the Schottky region. In accordance with an embodiment of the invention wherein dielectric layer 216 comprises BPSG, the etch process in FIG. 2E is designed to have minimal to no selectivity between silicon and oxide. As can be seen, the etch process depicted in FIG. 2E does not require a separate planarization medium (such as spin on glass) or CMP, and is a localized etch (i.e., is limited to the Schottky regions) and thus is not a global etch.

The reduction of the dielectric to silicon selectivity can be achieved in a number of ways. In one embodiment, the gas ratios are modified to minimize or eliminate the polymerizing gases which inhibit the silicon etch rate. In another embodiment, the free fluorine concentration is increased in the plasma to enhance the silicon etch rate. This can be achieved using gas additives such as oxygen, SF6 (sulfur hexafluoride) and/or NF3 (nitrogen tri-fluoride). The free fluorine concentration can also be increased by increasing the RF delivery frequency to better dissociate the etchant gas. In yet another embodiment, the pressure and power are manipulated to make the etch a less physical and more chemical process. This can be achieved by reducing the RF bias on the wafer. Any one or a combination of these techniques may be used to reduce the dielectric to silicon selectivity. In some embodiments, various combinations of RF delivery frequencies between 10 KHz and 3 GHz (for example, nominal value of 400 KHz), process pressures between 10 mTorr and 1 Torr (for example, nominal Value of 600 mTorr), input powers between 100 Watt and 2000 Watt (for example, nominal value of 400 Watt), main etchant gas flow between 40 sccm and 100 sccm (for example, nominal value of 80 sccm), and oxygen, nitrogen or fluorine addition between 0 sccm to 100 sccm (for example, nominal value of 20 sccm), and process temperatures of 0° C. to 100° C. (for example, nominal value of 20° C.) are used to arrive at the desired selectivity.

Figure 2F:
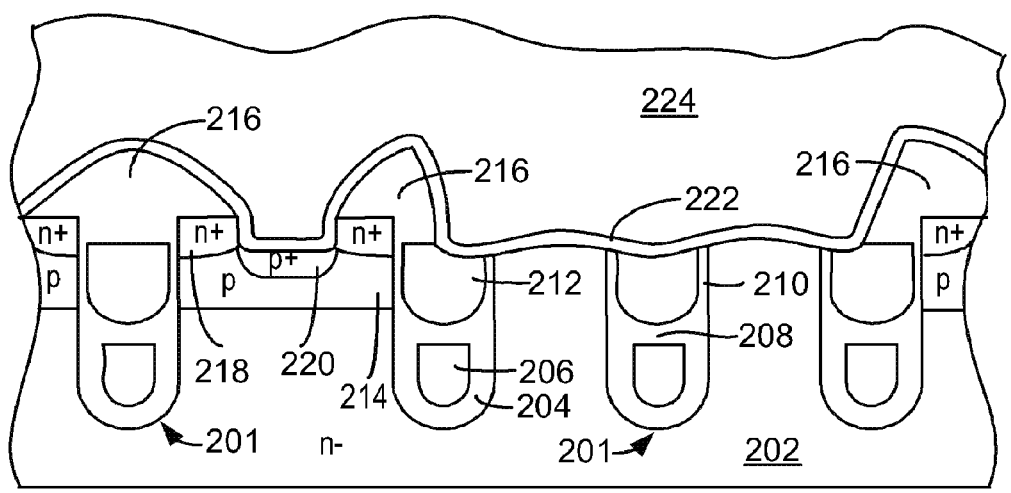

In FIG. 2F, a conformal barrier metal layer 222 is formed over the structure using known techniques. As can be seen, barrier metal 222 is substantially planar in the Schottky region. In one embodiment, barrier metal 222 comprises a bi-layer of titanium-tungsten and titanium-silicide. A conductive layer 224 (e.g., comprising aluminum) is then formed over barrier metal 222. Conductive layer 224 together with barrier metal layer 222 forms the source interconnect. As can be seen the source interconnect electrically contacts heavy body region 220 and source regions 218 but is insulated from gate electrodes 212 in the FET region. In the Schottky region, Schottky diode is formed where the source interconnect contacts the mesa regions 202 between the trenches. The source interconnect also contacts gate electrodes 212 in the Schottky region trenches. Thus, gate electrodes 212 in the Schottky region are electrically biased to the source potential during operation.

The various regions of the FET, including body region 214, heavy body region 220 and source regions 218 are included in FIG. 2F only to illustrate the complete device, and as such do not reflect the process sequence in which they are formed. That is, the body region, heavy body region and source regions may be formed at any suitable stage of the process.

Figure 3:
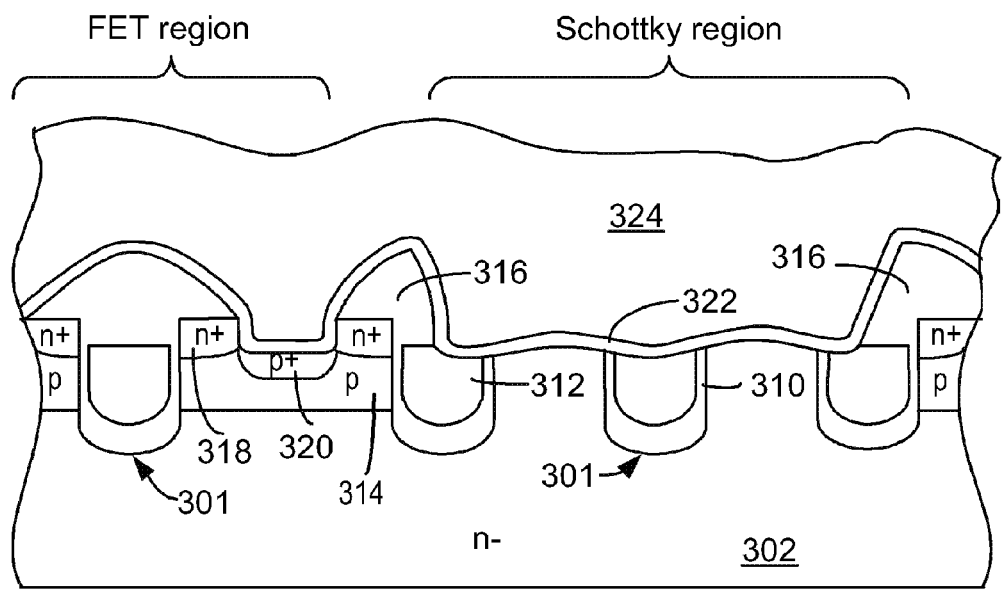
FIG. 3 shows a simplified cross section view of a monolithically integrated trench gate FET and Schottky diode wherein the Schottky contact etch technique according to an embodiment of the invention is used to obtain a substantially planar interconnect layer in the Schottky region.

FIG. 3 is a simplified cross section view of a monolithically integrated trench gate FET and Schottky diode wherein the Schottky contact etch technique according to an embodiment of the invention is advantageously used to obtain a substantially planar barrier metal layer in the Schottky region. Trenches 301 which include a gate electrode 312 with no underlying shield electrode terminate in drift region 302. Alternatively, trenches 301 may extend into and terminate in a highly doped substrate (not shown) underlying drift region 302. As shown, each trench 301 includes a thick-bottom-dielectric (e.g., comprising oxide) along a bottom portion of the trench to reduce the gate to drain capacitance, and a thinner gate dielectric (e.g., comprising gate oxide) lining the trench sidewalls. Alternatively, a gate dielectric layer with a relatively uniform thickness extends along the trench sidewalls and bottom. The same Schottky contact etch process and its variations described in connection with the preceding embodiment is used to achieve a substantially planar surface in the Schottky region. A substantially planar barrier metal 322 is thus obtained in the Schottky region.

Note that while the embodiments depicted by FIGS. 2A-2F and 3 show n-channel FETs, p-channel FETs may be obtained by reversing the polarity of the various semiconductor regions. Further, in the embodiment where drift regions 202 and 302 are an epitaxial layer extending over a substrate, MOSFETs are obtained where the substrate and epitaxial layer are of the same conductivity type, and IGBTs are obtained where the substrate has the opposite conductivity type to that of the epitaxial layer. These are only few trench FET devices in which the Schottky contact etch is used in accordance with the invention to obtain planar surfaces and superior leakage performance. The Schottky contact etch technique and its variants disclosed herein may be used in forming many other types of structures and devices to obtain similar advantages and features. For example, various types and structures of power devices are disclosed in the above-referenced U.S. patent application Ser. No. 11/026,276, filed Dec. 29, 2004. One skilled in the art would know how to integrate a Schottky diode in these devices, in particular in the trench gate, shielded gate, and charge balance devices shown, for example, in FIGS. 1, 2A, 3A, 3B, 4A, 4C, 5C, 9B, 9C, 10-12, and 24 of the U.S. patent application Ser. No. 11/026, 276. One skilled in the art would further know how to incorporate the Schottky contact etch or its variants disclosed herein in forming such integrated FET and Schottky diode devices in view of this disclosure.

Figure 4:
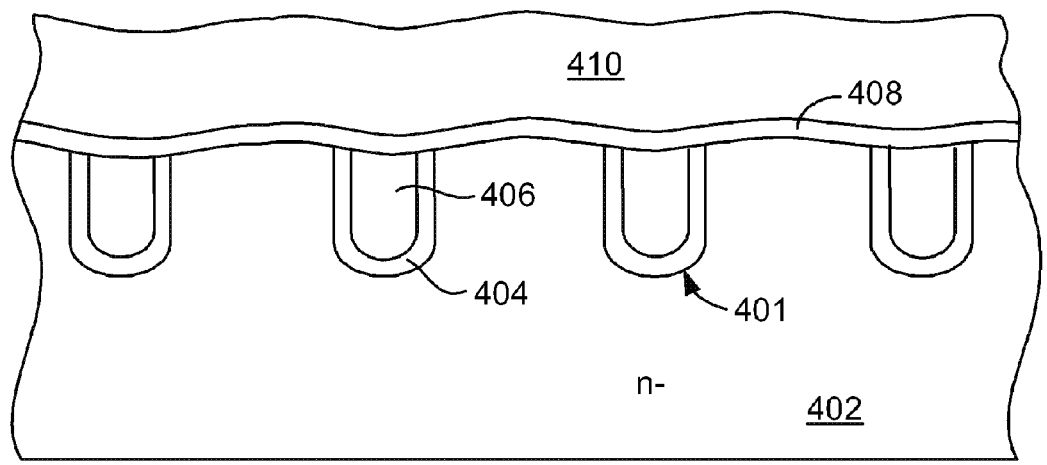
FIG. 4 shows a simplified cross section view of a TMBS rectifier wherein the Schottky contact etch according to an embodiment of the invention is used to obtain a substantially planar interconnect layer.

FIG. 4 shows a simplified cross section view of a TMBS rectifier wherein the Schottky contact etch technique described above is used to obtain a substantially planar barrier metal layer 408. Each trench 401 is lined with an insulating layer 406 (e.g., comprising oxide) and is filled with a conductive electrode 406 (e.g., comprising doped or undoped polysilicon). Conductive electrodes 406 are electrically connected and thus biased to the same potential as the top-side interconnect layer which comprises conductor 410 (e.g., comprising aluminum) and barrier metal layer 408 (e.g., comprising a bi-layer of titanium-tungsten and titanium-silicide). The operation of the devices shown in FIGS. 2F, 3 and 4 are well known in the art and thus will not be described.

Figure 5:
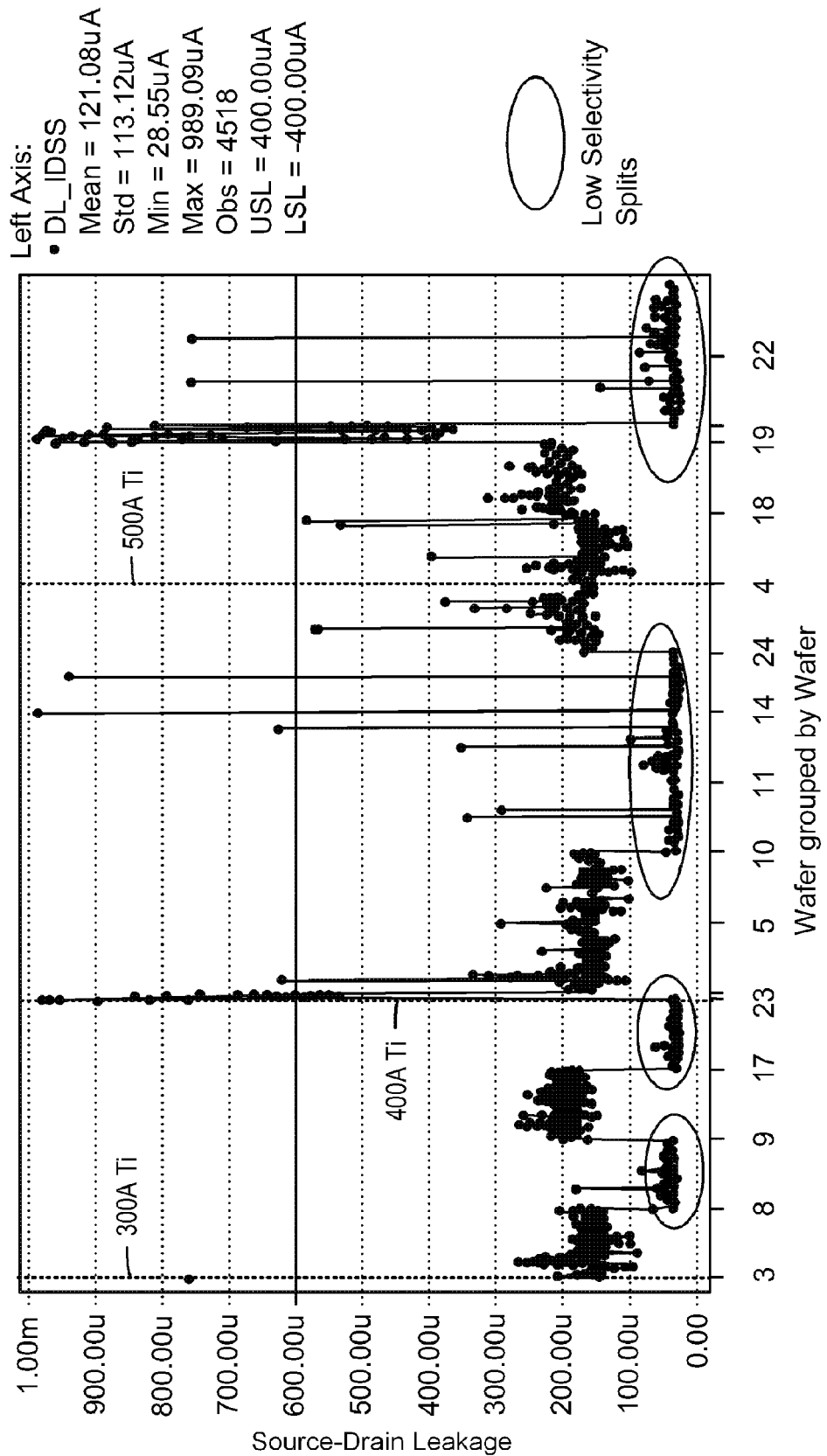
FIG. 5 is a graph which compares the drain-source leakage for monolithically integrated trench gate FET and Schottky diode devices fabricated using the low selectivity etch technique in accordance with one embodiment of the invention versus monolithically integrated trench gate FET and Schottky diode devices fabricated using conventional etch techniques.

FIG. 5 is graph which compares the drain-source leakage for monolithically integrated trench gate FET and Schottky diode devices fabricated using the low selectivity etch technique in accordance with one embodiment of the invention versus monolithically integrated trench gate FET and Schottky diode devices fabricated using conventional etch techniques. The vertical axis in the FIG. 5 graph represents the source-drain leakage and the horizontal axis represents the various groups of devices. The data points for devices formed using low selectively etch are circled. As can be seen, the source-drain leakage of devices using low selectivity etch is substantially lower (by a factor of 6 or more) as compared to those of devices using conventional etch techniques.

The table below tabulates source-drain leakage values for three conventional devices where no soft etch is used, 10 seconds of soft etch is used, and 20 seconds of soft etch is used. Also shown in the Table are corresponding source-drain leakage values for a device fabricated using the low selectivity etch technique in accordance with an embodiment of the invention. As can be seen, even where 20 seconds of soft etch is carried out, the low selectivity etch process yields a far better leakage performance.

|  | 0 sec. SE | 10 sec. | 20 sec. |
|---|---|---|---|
| Control | 667 µA | 180 µA | 158 µA |
| Low Selectivity Process | 38 µA | 35 µA | 35 µA |

Thus, low selectivity etch techniques for planarizing a Schottky contact structure have been described which do not require intermediate steps such as using a planarizing medium (e.g., spin on glass) or CMP. The dielectric (e.g., oxide) is etched at, or close to, the same rate as the underlying silicon in order to reduce the topology in the Schottky contact area. The reduced topology leads to better barrier metal step coverage. A substantially lower source-drain leakage current is thus achieved without the need for a soft etch.

Although a number of specific embodiments are shown and described herein, embodiments of the invention are not limited thereto. For example, while FIGS. 2A-2F show the Schottky region trenches to be identical in structure to the FET region trenches, the invention is not limited as such. In one embodiment, the Schottky region trenches are formed to include only one conductive electrode (e.g., shield electrode which extends to near the top of the trench) using known techniques. Therefore, the scope of the present invention should be determined not with reference to the above description but should, instead, be determined with reference to the appended claim, along with their full scope of equivalents.

What is claimed is:

1. A trench MOS barrier schottky (TMBS) rectifier comprising:
    a plurality of trenches extending into a semiconductor layer,
    a dielectric layer lining the trench sidewalls;
    a conductive electrode having a top surface that is substantially coplanar with a top surface of the semiconductor layer adjacent the trench; and
    an interconnect layer comprising a conformal barrier metal layer which contacts the semiconductor layer so as to form a schottky contact with the semiconductor layer.

2. The TMBS rectifier of claim 1 wherein the conformal barrier metal layer directly contacts the conductive electrode in each trench.

3. The TMBS rectifier of claim 1 wherein the conformal barrier metal layer is substantially planar.

4. The TMBS rectifier of claim 1 wherein a top surface of the conductive electrode in each trench is substantially coplanar with a top surface of the semiconductor layer.

5. The TMBS rectifier of claim 1 wherein the interconnect layer comprises a metal layer over and directly in contact with the conformal barrier layer.

6. A trench MOS barrier schottky (TMBS) rectifier comprising:
    a plurality of trenches extending into a semiconductor layer,
    a dielectric layer lining the trench sidewalls;
    a conductive electrode having a top surface that is substantially coplanar with a top surface of the semiconductor layer adjacent the trench; and
    an interconnect layer comprising a conformal barrier metal layer contacting the semiconductor layer so as to form a schottky contact with the semiconductor layer, the conformal barrier layer extending over and directly contacting the conductive electrode in each trench, a top surface of the conductive electrode in each trench being substantially coplanar with a top surface of the semiconductor layer such that the conformal barrier metal layer is substantially planar.

7. The TMBS rectifier of claim 1 wherein the interconnect layer comprises a metal layer over and directly in contact with the conformal barrier layer.

* * * * *